United States Patent
Yoon et al.

(10) Patent No.: US 7,017,597 B2
(45) Date of Patent: Mar. 28, 2006

(54) MEGASONIC CLEANING APPARATUS FOR FABRICATING SEMICONDUCTOR DEVICE

(75) Inventors: Byoung-moon Yoon, Suwon (KR); In-jun Yeo, Suwon (KR); Sang-rok Hah, Seoul (KR); Kyung-hyun Kim, Seoul (KR); Hyun-ho Jo, Seoul (KR); Jeong-lim Nam, Yongin (KR)

(73) Assignee: Samsung Electronics., Co.,Ltd., Kyungki-Do (KR)

( * ) Notice: Subject to any disclaimer, the term of this patent is extended or adjusted under 35 U.S.C. 154(b) by 338 days.

(21) Appl. No.: 10/217,006

(22) Filed: Aug. 12, 2002

(65) Prior Publication Data

US 2003/0178049 A1    Sep. 25, 2003

(30) Foreign Application Priority Data

Mar. 23, 2002    (KR) .............................. 2002-15906

(51) Int. Cl.
    *B09B 3/10*        (2006.01)
(52) U.S. Cl. ........................ 134/184; 134/186; 134/902
(58) Field of Classification Search ................ 134/184, 134/186, 147, 148; 310/346, 323.19, 334; 366/127
    See application file for complete search history.

(56) References Cited

U.S. PATENT DOCUMENTS

| | | | | |
|---|---|---|---|---|
| 2,806,328 A * | 9/1957 | Bradfield | ..................... | 451/165 |
| 2,889,580 A * | 6/1959 | Wald, Jr. et al. | .............. | 65/21.2 |
| 2,891,178 A * | 6/1959 | Elmore | ......................... | 310/26 |
| 2,891,180 A * | 6/1959 | Elmore | ......................... | 310/26 |
| 3,088,343 A * | 5/1963 | Kuris et al. | .................. | 228/1.1 |
| 3,103,310 A * | 9/1963 | Lang | .............................. | 239/4 |
| 3,325,348 A * | 6/1967 | Bennett | ....................... | 162/216 |
| 3,375,820 A * | 4/1968 | Kuris et al. | ................. | 601/142 |
| 4,131,505 A * | 12/1978 | Davis, Jr. | ................ | 156/580.1 |
| 4,144,882 A * | 3/1979 | Takemoto et al. | ............ | 604/22 |
| 4,176,454 A * | 12/1979 | Hatter et al. | ................. | 433/119 |
| 4,302,485 A * | 11/1981 | Last et al. | ................... | 427/601 |
| 4,504,264 A * | 3/1985 | Kelman | ....................... | 604/22 |
| 4,607,185 A * | 8/1986 | Elbert et al. | ........... | 310/323.19 |
| 4,757,227 A * | 7/1988 | Danley et al. | ......... | 310/323.19 |
| 5,390,013 A * | 2/1995 | Snelling | ..................... | 399/328 |
| 5,975,094 A * | 11/1999 | Shurtliff | ..................... | 134/1.3 |
| 6,021,785 A * | 2/2000 | Grutzediek et al. | .......... | 134/1.3 |
| 6,039,059 A | 3/2000 | Bran | | |
| 6,140,744 A * | 10/2000 | Bran | .......................... | 310/346 |
| 6,165,150 A * | 12/2000 | Banko | .......................... | 604/22 |
| 6,679,272 B1 * | 1/2004 | Bran et al. | .................... | 134/1.3 |
| 6,723,110 B1 * | 4/2004 | Timm et al. | ................. | 606/169 |
| 6,754,980 B1 * | 6/2004 | Lauerhaas et al. | ............ | 34/594 |
| 2003/0141784 A1 * | 7/2003 | Bran | .......................... | 310/328 |
| 2003/0200986 A1 * | 10/2003 | Yeo et al. | ..................... | 134/1.3 |

FOREIGN PATENT DOCUMENTS

JP        64-27550        *    1/1989

* cited by examiner

*Primary Examiner*—Frankie L. Stinson
(74) *Attorney, Agent, or Firm*—F. Chau & Associates, LLC

(57) ABSTRACT

A megasonic cleaning apparatus is provided for removing contamination particles on a wafer. The megasonic cleaning apparatus includes a piezoelectric transducer and an energy transfer rod. The piezoelectric transducer is for generating megasonic energy. The energy transfer rod installed over the wafer along a radial direction of the wafer is for distributing the megasonic energy to cleaning solution over the wafer and for vibrating the cleaning solution. The energy transfer rod is shaped and sized to uniformly distribute energy in the radial direction of the wafer through the cleaning solution to remove the contamination particles from the wafer.

14 Claims, 4 Drawing Sheets

MEGASONIC CLEANING APPARATUS FOR FABRICATING SEMICONDUCTOR DEVICE

BACKGROUND OF THE INVENTION

1. Field of the Invention

The present invention relates to a megasonic cleaning apparatus for fabricating a semiconductor device, and more particularly, to a megasonic cleaning apparatus capable of obtaining a sufficient level of cleaning effect and preventing pattern lifting.

2. Description of the Related Art

With increases in the integration of semiconductor devices, the size of patterns and the interval between patterns become very small. Accordingly, wafer cleaning becomes important because contamination particles existing on the surface of a wafer could cause poor patterns in subsequent processes, for example, contamination particles which remain between the patterns formed of a conductive film could render the semiconductor device inoperative.

With a reduction of the size of a fine pattern to 1 μm or less, the permissible size of a contamination particle also decreases. Thus, it can be difficult to remove those small contamination particles through conventional cleaning methods because of the strong adhesion force upon a wafer.

Many methods for increasing the cleaning efficiency have been proposed to effectively provide a force capable of overcoming the adhesion force of material to be removed from a wafer.

One proposed method for removing contamination particles is to use a megasonic cleaning apparatus. The megasonic cleaning apparatus uses a stream of fluid, which is agitated at high frequency. The fluid used can be, for example, deionized water. The fluid stream is shot at the wafer to remove the contamination particles from the wafer surface and/or recessed surface of the wafer.

A megasonic cleaning apparatus basically includes a piezoelectric transducer for generating megasonic energy and an energy transfer means for transferring energy generated by the piezoelectric transducer to fluid medium. The energy transferred through the energy transfer means agitates the fluid medium so that the fluid medium has a high frequency. This agitated medium vibrates the wafer surface, such that contamination particles are physically separated from the wafer surface.

FIG. 1 shows a conventional megasonic cleaning apparatus having a quartz rod 20 to serve as an energy transfer means. The quartz rod 20 transfers energy generated by a piezoelectric transducer 10 to fluid medium, that is, cleaning solution 15, and has a cylindrical cleaning portion 20a and a tapered rear portion 20b. The energy transferred to the cleaning solution 15 through the quartz rod 20 agitates the cleaning solution 15 at a high frequency. The vibrated cleaning solution 15 vibrates a wafer 30 and removes contamination particles from the surface of the wafer 30. At this moment, the entire surface of the wafer 30 is cleaned by being rotated along the rotation of a spin plate 40 disposed under the wafer 30.

In the conventional megasonic cleaning apparatus, the amount of the energy applied from the quartz rod 20 to the wafer 30 through the cleaning solution 15 may not be uniform over the wafer 30 in the length direction of the quartz rod 20, that is, from the wafer edge E to the wafer centre C.

FIG. 2 shows a graph showing a variation of energy transferred to a wafer depending on the positions over the wafer according to the apparatus of FIG. 1. Referring to FIG. 2, the largest energy is applied to the wafer edge E, and the energy applied to the wafer 30 decreases toward the wafer centre C. That is, a conventional megasonic cleaning apparatus concentrates energy on the wafer edge E. This arises from the phenomenon that the largest energy comes out from the wafer edge E because the cleaning solution 15 on the wafer edge E contacts the quartz rod 20 first.

Accordingly, the amount of energy generated by the piezoelectric transducer 10 must increase to ensure that the wafer centre C to which a relatively small amount of energy is applied has a sufficient cleaning effect. However, if the energy amount increases for obtaining a sufficient cleaning effect, the wafer edge E receives excessive energy, leading to a serious problem that patterns P located around the wafer edge E are lifted. Thus, there is a need for a megasonic cleaning apparatus capable of delivering optimal energy throughout the wafer for effectively cleaning the wafer and preventing pattern lifting.

SUMMARY OF THE INVENTION

A megasonic cleaning apparatus is provided for removing contamination particles on a wafer. The megasonic cleaning apparatus includes: a piezoelectric transducer for generating megasonic energy; and an energy transfer rod installed over the wafer along a radial direction of the wafer for distributing the megasonic energy to cleaning solution over the wafer and for vibrating the cleaning solution, wherein the energy transfer rod is shaped and sized to uniformly distribute energy in the radial direction of the wafer through the cleaning solution to remove the contamination particles from the wafer.

According to an embodiment of the present invention, the energy transfer rod dissipates varying amounts of energy in the radial direction. The energy transfer rod is formed of inert noncontamination material. The noncontamination material is one of sapphire, silicon carbide, boron nitride, vitreous carbon, and quartz.

According to an embodiment of the present invention, the energy transfer rod having a first end and a second end and the diameter of the first end is smaller than that of the second end. The energy transfer rod includes a leading end, an elongated front portion, and a rear portion tapered to have a larger cross-section diameter than the front portion. The leading end is located over the centre of the wafer. The energy transfer rod includes a groove formed on the elongated front portion to make energy distribution uniform over the wafer. The groove is formed from the position of the elongated front portion over the wafer edge to the leading end. The groove is tapered in a semiconical shape to have a maximum radius at the position of the elongated front portion. An end of the groove opposite to the leading end is gradually shallow from a position over the wafer edge. The end of the groove opposite to the leading end is slanted. The groove is filled with the cleaning solution such that a part of energy is dissipated by the cleaning solution filled in the groove.

According to an embodiment of the present invention, the megasonic cleaning apparatus further includes a vessel for housing the cleaning solution and the wafer, wherein the elongated front portion of the energy transfer rod is located within the vessel. The megasonic cleaning apparatus further includes a spin plate located within the vessel, the spin plate for supporting and spinning the wafer. The megasonic cleaning apparatus further includes a cleaning solution spray nozzle installed over the wafer to spray a cleaning solution between the energy transfer rod and the wafer and the groove.

A method for uniformly distributing megasonic energy in a megasonic cleaning apparatus to a cleaning solution over a wafer is also provided, which includes the steps of: generating megasonic energy using a piezoelectric transducer; distributing the megasonic energy over an energy transfer rod disposed along a radial direction over the wafer; varying the megasonic energy by an energy controlling element as the energy is distributing along the radial direction.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
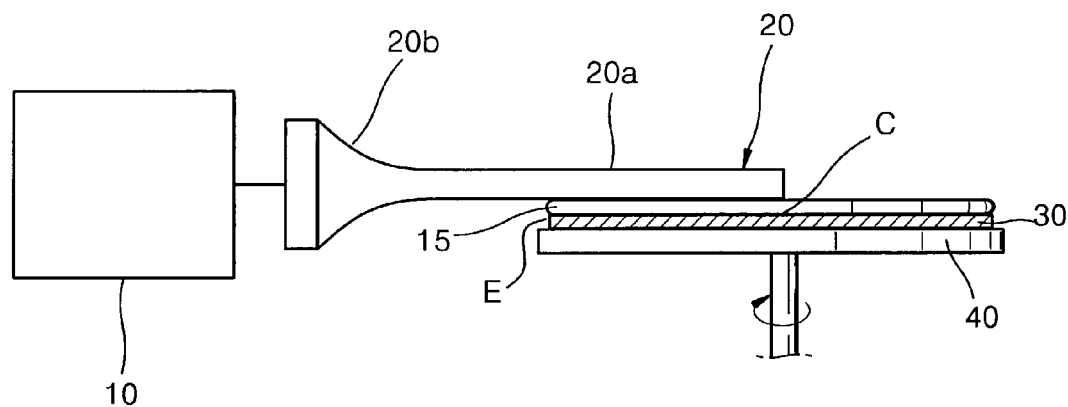
FIG. 1 shows a conventional megasonic cleaning apparatus.
Figure 2:
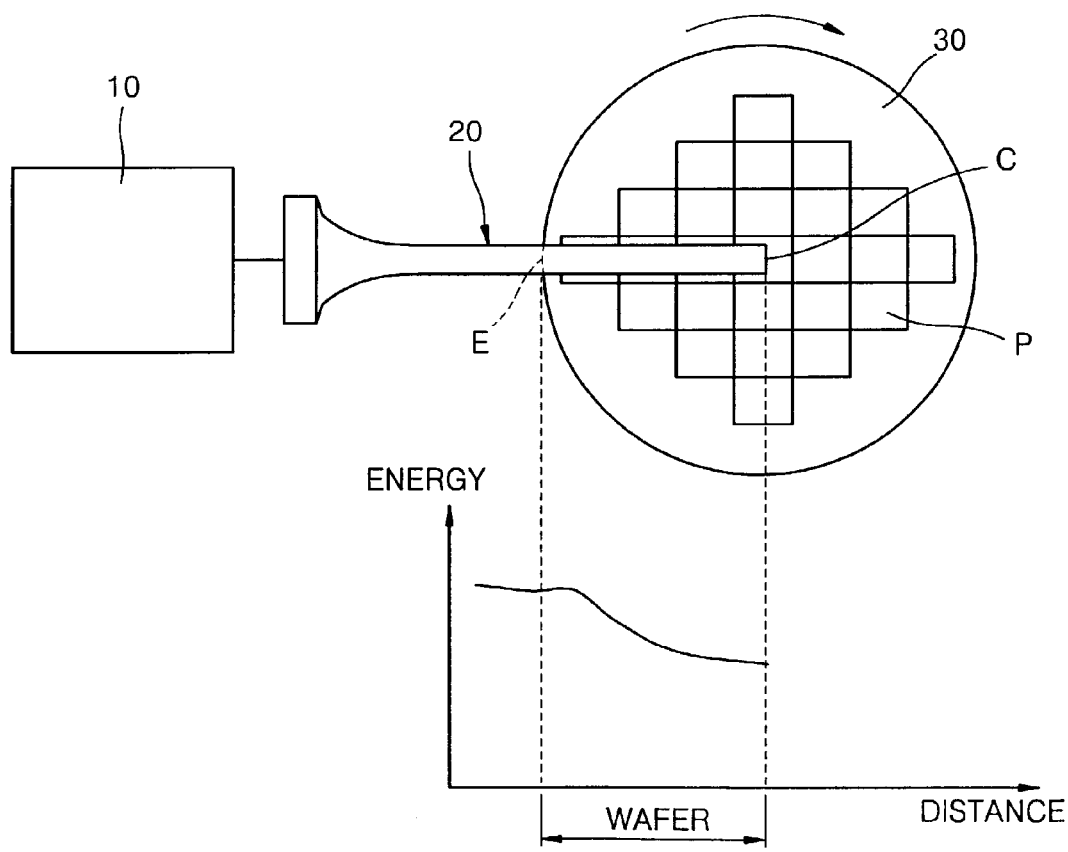
FIG. 2 shows a graph showing a variation of energy transferred to a wafer depending on the positions over the wafer according to the apparatus of FIG. 1.

Hereinafter, embodiments of the present invention will be described in detail with reference to the attached drawings. However, the embodiments of the present invention can be modified into various other forms, and the scope of the present invention should not be interpreted as being restricted to the embodiments. The present invention includes alternatives, modifications and equivalents that can be included within the spirit and scope of the invention defined by the attached claims. Like reference numerals in the drawings denote the same members.

Figure 3:
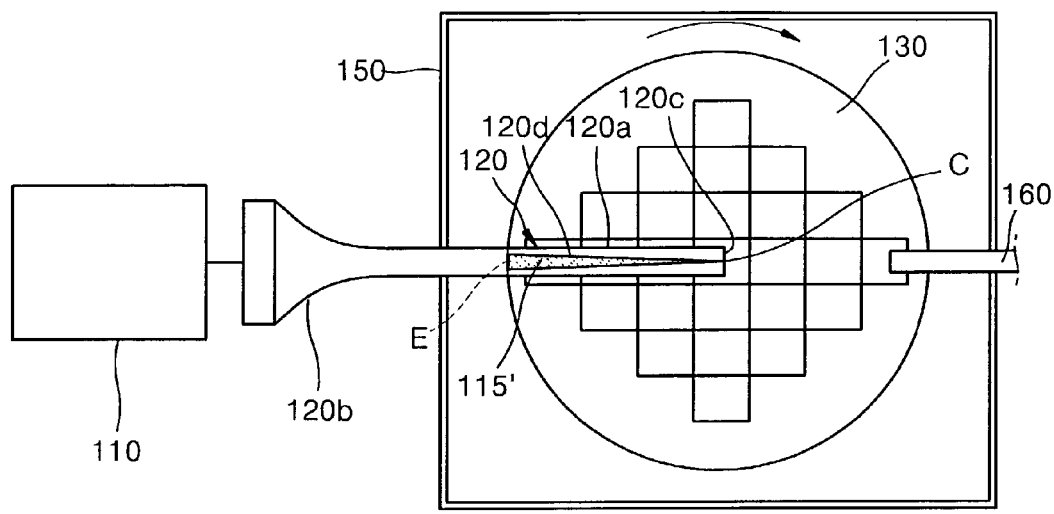
FIG. 3 is a top view of a megasonic cleaning apparatus according to an embodiment of the present invention.
Figure 4:
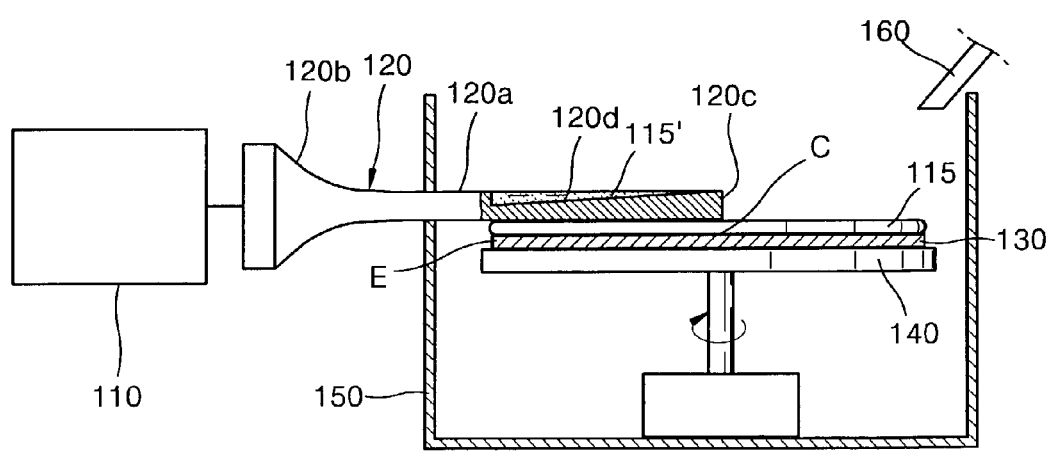
FIG. 4 is a side cross-sectional view of the apparatus of FIG. 3.

FIG. 3 is a top view of a megasonic cleaning apparatus according to an embodiment of the present invention and FIG. 4 is a side cross-sectional view of the apparatus of FIG. 3.

Referring to FIGS. 3 and 4, the megasonic cleaning apparatus includes a piezoelectric transducer 110 and an energy transfer rod 120 connected to the piezoelectric transducer 110 and disposed over a wafer 130 in a radial direction. The piezoelectric transducer 110 generates megasonic energy. The energy transfer rod 120 transfers the megasonic energy generated by the piezoelectric transducer 110 to a cleaning solution 115 on the wafer 130 to vibrate the cleaning solution. The megasonic energy is applied to the wafer 130 through the vibrated cleaning solution 115 by the energy transfer rod 120 and shakes loose the contamination particles on the wafer 130 to remove them from the wafer 130.

According to an embodiment of the present invention, the energy transfer rod 120 is preferably formed of inert non-contamination material, which effectively transfers the megasonic energy generated by the piezoelectric transducer 110. More preferably, the energy transfer rod 120 can be formed of sapphire, silicon carbide (SiC), boron nitride (BN), vitreous carbon, or quartz.

The energy transfer rod 120 is designed to apply uniform energy to the wafer 130 through the vibrated cleaning solution 115 to remove contamination particles. According to an embodiment of the present invention, the energy transfer rod 120 is shaped and sized to vary the amount of the cleaning solution 115 flowing therethrough which in turn makes uniform the energy applied to the wafer 130. The variation depends on the shape of the energy transfer rod 120 in relation to the position of the wafer 130. The energy transfer rod 120 is a rod type and one end of the energy transfer rod 120 has a smaller radius than the other end. The energy transfer rod 120 has a leading end 120c, an elongated front portion 120a, and a tapered rear portion 120b having a larger cross-section radius than that of the front portion 120a. The leading end 120c is located substantially on the centre C of the wafer. Preferably, the front portion 120a includes a groove 120d formed on its upper part to prevent energy concentration on a wafer edge E. The groove 120d is filled with cleaning solution 115' for dissipating a part of the energy being distributed through the energy transfer rod 120.

According to an embodiment of the present invention, the cleaning solution 115 and the wafer 130 are housed within a vessel 150. The elongated front portion 120a of the energy transfer rod 120 is also housed within the vessel 150. A spin plate 140 is further included in the megasonic cleaning apparatus for supporting and spinning the wafer 130. The cleaning solution 115 is introduced between the energy transfer rod 120 and the wafer 130 from a cleaning solution spraying nozzle 160 installed over the wafer 130. The cleaning solution 115 can be either a special cleaning solution containing various compounds or general deionized water.

Figure 5:
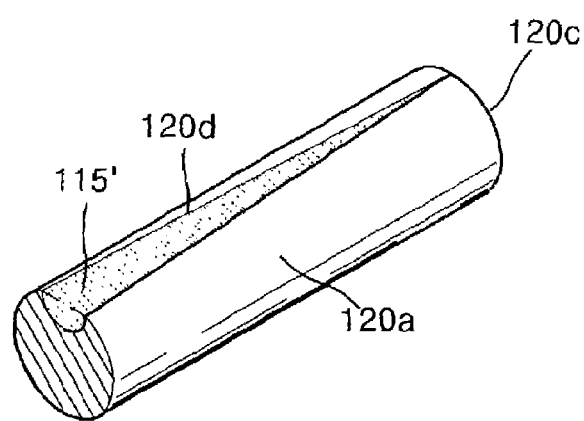
FIG. 5 is a perspective view illustrating a groove formed on an energy transfer rod of FIGS. 3 and 4.

FIG. 5 is a perspective view illustrating the groove 120d formed on the energy transfer rod 120 of FIGS. 3 and 4.

Referring to FIG. 5, the groove 120d is formed from a place corresponding to the wafer edge E to the leading end 120c and tapered in a semiconical shape to have a maximum radius on the place corresponding to the wafer edge E. Thus, the energy distributed to the cleaning solution 115' filled in the groove 120d is maximum at the place corresponding to the wafer edge E, and the amount of energy distributed to the medium filled in the energy transfer rod 120 gradually decreases toward the wafer centre. Accordingly, the amount of energy transferred to the wafer 130 is made uniform over the wafer surface in a radial direction from the wafer center C to the wafer edge E.

According to an embodiment of the present invention, the groove 120d is designed in a semiconical shape in consideration of convenience of a groove formation process. One skilled in the art appreciates that any shape similar to or different from a groove which accomplish the spirit of the present invention can be used if these shapes compensate for the energy non-uniformity problem of the prior art. In case of the semiconical groove, the radius and depth are determined to be different as needed.

Figure 6:
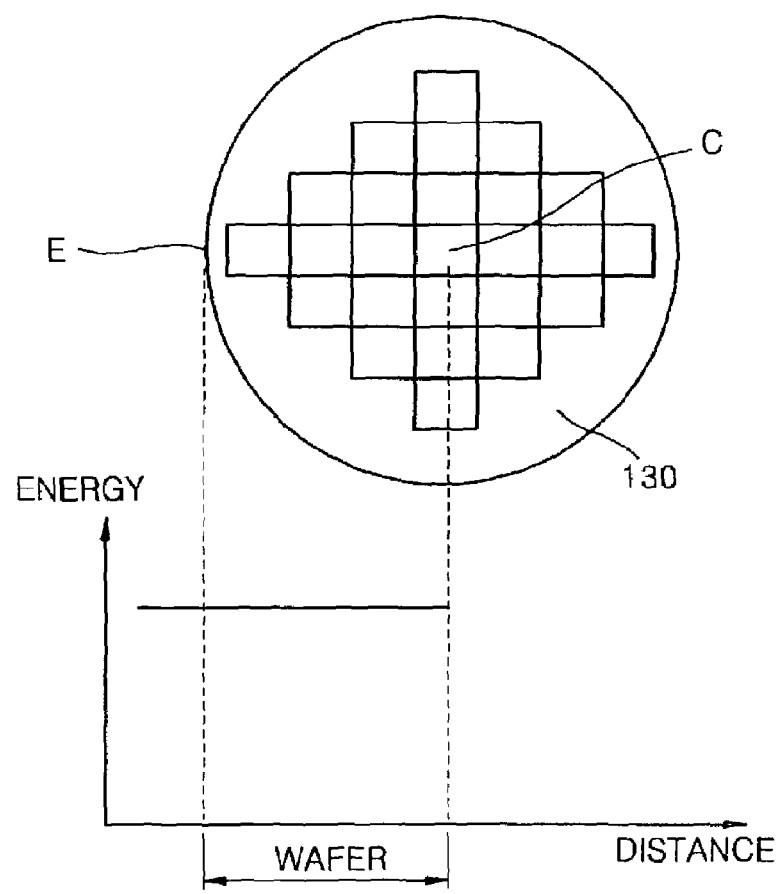
FIG. 6 is a graph showing energy transferred to a wafer versus the positions over the wafer of FIGS. 3 and 4.

FIG. 6 shows a graph showing a variation of energy transferred to the wafer 130 depending on the positions over the wafer 130 of FIGS. 3 and 4.

As can be seen from FIG. 6, the energy distribution is uniform throughout the entire surface of the wafer 130 by appropriately designing the groove 120d of the energy transfer rod 120. Advantageously, the amount of energy applied to the wafer 130 through the cleaning solution 115 by the energy transfer rod 120 is made uniform in the length direction of the energy transfer rod 120, for example, from the wafer edge E to the wafer centre C. Thus, energy does not concentrate in one area on the wafer 130, thereby effectively removing contamination particles from the surface of the wafer 130 without lifting patterns on the wafer 130.

Figure 7:
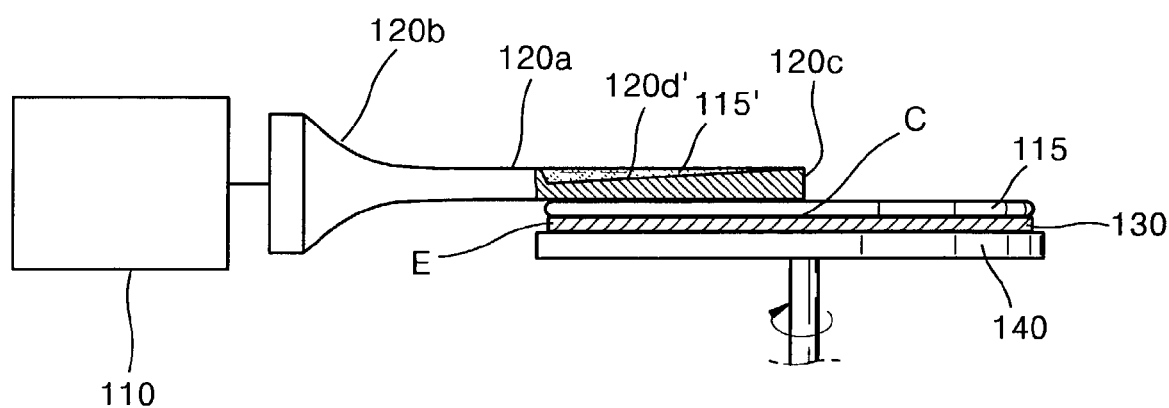
FIG. 7 is a side cross-sectional view illustrating a groove formed on the energy transfer rod of FIGS. 3 and 4 according to another embodiment of the present invention.

FIG. 7 is a side cross-sectional view of a groove formed on the energy transfer rod of FIGS. 3 and 4 according to another embodiment of the present invention.

Referring to FIG. 7, a groove 120d' for preventing energy concentration on the wafer edge E has a similar shape as in FIGS. 3 and 4, but an end of the groove 120d' opposite to the leading end 120c is gradually shallow from a position over the wafer edge E of the wafer 130. That is, the end of the groove 120d' opposite to the leading end 120c is preferably slanted.

The embodiments are provided to more completely explain the present invention to those skilled in the art. Although the invention has been described with reference to particular embodiments, it will be apparent to one of ordinary skill in the art that modifications of the described embodiments may be made without departing from the spirit and scope of the invention. The above embodiments of the present invention describe a preferred energy transfer rod having a groove to achieve uniform energy application to a wafer. However, the energy transfer rod can have various different shapes if they achieve the objects of the present invention. Accordingly, the scope of the present invention must be defined by the appended claims and their equivalents.

What is claimed is:

1. A megasonic cleaning apparatus for removing contamination particles on a wafer, comprising:
    a piezoelectric transducer for generating megasonic energy; and
    an energy transfer rod installed over the wafer along a radial direction of the wafer for distributing the megasonic energy to cleaning solution over the wafer and for vibrating the cleaning solution, wherein the energy transfer rod is shaped and sized to uniformly distribute energy in the radial direction of the wafer through the cleaning solution to remove the contamination particles from the wafer, wherein the energy transfer rod includes a first end and a second end and the diameter of the first end is smaller than that of the second end, wherein the energy transfer rod further includes an elongated front portion and a rear portion tapered to have a larger cross-section diameter than the elongated front portion, and wherein the energy transfer rod includes a groove formed on the elongated front portion to make energy distribution uniform over the wafer.

2. The megasonic cleaning apparatus of claim 1, wherein the energy transfer rod dissipates varying amounts of energy in the radial direction.

3. The megasonic cleaning apparatus of claim 1, wherein the energy transfer rod is formed of inert noncontamination material.

4. The megasonic cleaning apparatus of claim 3, wherein the noncontamination material is one of sapphire, silicon carbide, boron nitride, vitreous carbon, and quartz.

5. The megasonic cleaning apparatus of claim 1, wherein the first end is located over the centre of the wafer.

6. The megasonic cleaning apparatus of claim 1, wherein the groove is formed from the position of the elongated front portion over the wafer edge to the first end.

7. The megasonic cleaning apparatus of claim 6, wherein the groove is tapered in a semiconical shape to have a maximum radius at the position of the elongated front portion.

8. The megasonic cleaning apparatus of claim 7, wherein an end of the groove opposite to the first end is gradually shallow from a position over the wafer edge.

9. The megasonic cleaning apparatus of claim 8, wherein the end of the groove opposite to the first end is slanted.

10. The megasonic cleaning apparatus of claim 1, wherein the groove is filled with the cleaning solution such that a part of energy is dissipated by the cleaning solution filled in the groove.

11. The megasonic cleaning apparatus of claim 1, further comprising a vessel for housing the cleaning solution and the wafer, wherein the elongated front portion of the energy transfer rod is located within the vessel.

12. The megasonic cleaning apparatus of claim 11, further comprising a spin plate located within the vessel, the spin plate for supporting and spinning the wafer.

13. A megasonic cleaning apparatus for removing contamination particles on a wafer, comprising:
    a piezoelectric transducer for generating megasonic energy;
    an energy transfer rod installed over the wafer along a radial direction of the wafer for distributing the megasonic energy to cleaning solution over the wafer and for vibrating the cleaning solution, wherein the energy transfer rod is shaped and sized to uniformly distribute energy in the radial direction of the wafer through the cleaning solution to remove the contamination particles from the wafer, wherein the energy transfer rod includes a first end and a second end and the diameter of the first end is smaller than that of the second end, wherein the energy transfer rod further includes an elongated front portion and a rear portion tapered to have a larger cross-section diameter than the elongated front portion;
    a vessel for housing the cleaning solution and the wafer, wherein the elongated front portion of the energy transfer rod is located within the vessel; and
    a cleaning solution spray nozzle installed over the wafer to spray a cleaning solution between the energy transfer rod and the wafer and a groove formed on the elongated front portion.

14. A megasonic cleaning apparatus for removing contamination particles on a wafer, comprising:
    a piezoelectric transducer for generating megasonic energy; and
    an energy transfer rod having a groove tapered, installed over the wafer along a radial direction of the wafer for distributing the megasonic energy to cleaning solution over the wafer and for vibrating the cleaning solution, wherein the cleaning solution is filled in the groove of the energy transfer rod to uniformly distribute energy in the radial direction of the wafer through the cleaning solution to remove the contamination particles from the wafer.

* * * * *